United States Patent [19]

Wyler et al.

[11] Patent Number: 4,998,102
[45] Date of Patent: Mar. 5, 1991

[54] INTEGRATED METER TRANSPONDER

[75] Inventors: Craig S. Wyler, St. Charles County; Mark E. Aubuchon, St. Louis County, both of Mo.

[73] Assignee: Distribution Control Systems, Inc., St. Louis, Mo.

[21] Appl. No.: 227,343

[22] Filed: Aug. 2, 1988

[51] Int. Cl.⁵ .............................................. G08C 19/00
[52] U.S. Cl. ......................... 340/870.020; 340/870.18
[58] Field of Search ...................... 340/870.20, 870.02, 340/870.03, 870.06, 870.11, 870.18, 870.27, 310 A; 439/926, 919, 893, 894; 361/372, 369, 370, 371, 374, 399, 415; 174/38; 324/156, 157, 113

[56] References Cited

U.S. PATENT DOCUMENTS

| | | | |
|---|---|---|---|
| 3,006,712 | 10/1961 | Eichacker | 340/870.11 |
| 3,094,364 | 6/1963 | Lingg | 439/237 |
| 4,037,904 | 7/1977 | Arnold et al. | 439/248 |
| 4,070,081 | 1/1978 | Takahashi | 339/91 R |
| 4,110,814 | 8/1978 | Britton et al. | 324/156 |
| 4,163,939 | 8/1979 | Halstead et al. | 324/156 |
| 4,491,789 | 1/1985 | Benbow | 324/157 |
| 4,636,019 | 1/1987 | Gillett et al. | 439/62 |
| 4,638,314 | 1/1987 | Keller | 340/870.02 |
| 4,647,130 | 3/1987 | Blair et al. | 439/248 |
| 4,664,458 | 3/1987 | Worth | 439/82 |
| 4,669,030 | 5/1987 | Bannister | 361/399 |
| 4,744,004 | 5/1988 | Hammond | 324/156 |
| 4,804,287 | 2/1989 | Purdy | 361/399 |

OTHER PUBLICATIONS

Electronic Engineers Master Catalog, 1987-88, vol. C (2 pages: Miniglossary Connectors page and p. C-1190).

Primary Examiner—Donald J. Yusko
Assistant Examiner—Yuk H. Lau
Attorney, Agent, or Firm—Polster, Polster and Lucchesi

[57] ABSTRACT

An electricity meter transponder package includes an electricity meter and a cover for containing the meter. The cover is secured to the meter by a predetermined rotation of the cover with respect to the meter. A first electrical connector-half is fixedly mounted with respect to the meter, that connector-half having terminals electrically connected to the meter. A second electrical connector-half having terminals mateable with the terminals of the first connector-half is fixedly mounted with respect to the cover in a position such that the predetermined rotation of the cover with respect to the meter causes the terminals of the first and second connector-halves to mate to complete electrical connection between their respective terminals. At least one electrical circuit is carried by the cover, which circuit is electrically connected to at least some terminals of the second connector-half. Securing of the cover to the meter results in automatic electrical connection between the meter and the circuit carried by the cover.

6 Claims, 2 Drawing Sheets

INTEGRATED METER TRANSPONDER

BACKGROUND OF THE INVENTION

This invention relates to carrier wave intelligence transmission systems in general and, more particularly, to apparatus useful in transmitting intelligence from electricity meters over electric power distribution networks to a central site.

The use of electric power lines for meter reading and other communications purposes is well known in the art. It is known that a modulation voltage can be superimposed on a power system voltage to cause wave shape perturbations in the carrier wave. In the embodiment described hereinafter, the carrier wave is the voltage wave of an electrical power distribution system. Communication over electric power distribution lines is useful for signaling, meter reading, and load control, among other uses. Functions such as automatic meter reading require that information passes from the end user back to the central station. See U.S. Pat. Nos. 4,106,007, 4,218,655, and 4,400,688 to Johnston et al, and 4,105,897 to Stratton et al, which patents are incorporated herein by reference.

By way of example, manual reading of electricity meters is highly labor-intensive and its costs are significant. When access to meters is impossible, billings are made on the basis of estimated readings, and such estimated billings often lead to customer complaints.

Currently available electricity meters such as watt-hour meters work well for their intended purpose, but they must be manually read. For automatic or remote meter reading, a transponder unit must be used with such meters to detect the output of such meters and transmit that information back to a central site. Since there are several different, yet fairly standard meters currently available, it would be desirable to use those meters as part of a meter/transponder package. But inasmuch as there are different meters available, that would appear to require different transponder models for each of the different meter models. Designing, manufacturing and stocking a number of different transponder unit models would, however, be expensive.

Since electricity meters are, in general, exposed to the elements, it is necessary that any meter/transponder package provide some way to protect the electronics of the transponder from the elements. Current meter covers, however, are too small to accommodate the necessary electronics, particularly if the present ability to manually read the meter is to be retained. Space is often at a premium in the locations where electricity meters are disposed, which would seem to dictate the smallest possible size for meter/transponder packages. This presents another problem, however, since the electrical components of transponder units generate a quantity of heat which must be dissipated so that the components will not be damaged. In addition to internally generated heat, the transponder must also be protected from ultraviolet deterioration, humidity, temperature extremes and fluctuations, greenhouse effects, and shock and vibration.

In order to avoid the need to extensively retrain those people who install electricity meters, it would be desirable to have the on-site installation procedures for meter/transponder packages as similar as possible to existing installation procedures for present meters. This would seem to be difficult, however, since the transponder performs a completely different function than that performed by existing manually read meters.

For repair and maintenance purposes it is sometimes necessary to remove the transponder electronics from the meter/transponder package. But it is undesirable to have to remove or replace the meter during that procedure. A transponder built into the meter, however, can only be removed or replaced by removing the meter as well.

SUMMARY OF THE INVENTION

Among the various objects and features of the present invention may be noted the provision of an integrated meter transponder which uses existing electricity meters as part thereof.

Another object of this invention is to provide such a meter transponder which eliminates special adaptation hardware or procedures from one meter manufacturer's model to another.

Another object is to provide a meter transponder which is modular in construction so as to allow convenient replacement of disabled components as well as simple direct assembly.

Another object of this invention is to provide a meter transponder which mounts to existing structure on the electricity meter base.

Another object is to provide a meter transponder which can be visually read or remotely read.

Another object is to provide such a transponder which is compact in construction yet has adequate heat dissipation.

A further object is to provide a meter transponder which is protected from environmental extremes.

Other objects and features of this invention will be apparent to those skilled in the art in light of the following description and accompanying drawings.

Briefly, an electricity meter transponder package of the present invention includes an electricity meter assembly including an electricity meter such as a watt-hour meter mounted on a meter base and having terminals for connection to a circuit having a variable such as watthours to be measured. A cover having an open end and an inner recess receives the meter assembly, the cover being securable to the meter assembly to protect the meter assembly from environmental factors such as rain, dust and the like. A predetermined relative movement of the cover with respect to the meter assembly is required to secure the cover to the assembly. A first electrical connector-half is fixedly mounted with respect to the meter assembly, the connector-half having terminals electrically connected to the meter assembly. A second electrical connector-half having terminals mateable with the terminals of the first connector-half is fixedly mounted with respect to the cover in a position such that the predetermined relative movement of the cover with respect to the meter assembly causes the terminals of the first and second connector-halves to mate to complete electrical connection between their respective terminals. At least one electrical circuit is carried by the cover, the circuit being electrically connected to at least some terminals of the second connector-half, whereby securing of the cover to the meter assembly results in automatic electrical connection between the meter assembly and the circuit carried by the cover.

In a second aspect of the present invention, an electricity meter transponder package includes an electricity meter such as a watthour meter having a first electrical connector-half fixedly mounted with respect to the meter. The connector-half has terminals electrically connected to the meter, the meter also having terminals for connection to a circuit having a variable such as watthours to be measured. A cover has an open end and an inner recess for receiving the electricity meter to protect the meter. A predetermined relative rotational movement of the cover with respect to the meter is required to secure the cover to the meter. A second electrical connector-half having terminals mateable with the terminals of the first connector-half is fixedly mounted with respect to the cover in a position such that the predetermined relative movement of the cover with respect to the meter causes the terminals of the first and second connector-halves to mate to complete electrical connection between their respective terminals. The terminals of at least one of the electrical connector-halves are mechanically floating throughout a predetermined range of movement so that variations of the relative rotational movement of the electrical connector halves from true linear motion as the cover is rotated with respect to the meter is accommodated by floating of the terminals. At least one electrical circuit is carried by the cover, the circuit being electrically connected to at least some terminals of the second connector-half, whereby securing of the cover to the meter results in automatic electrical connection between the meter and the circuit carried by the cover.

BRIEF DESCRIPTION OF THE DRAWINGS

Similar reference characters indicate similar parts throughout the several views of the drawings.

DESCRIPTION OF THE PREFERRED EMBODIMENT

Figure 1:
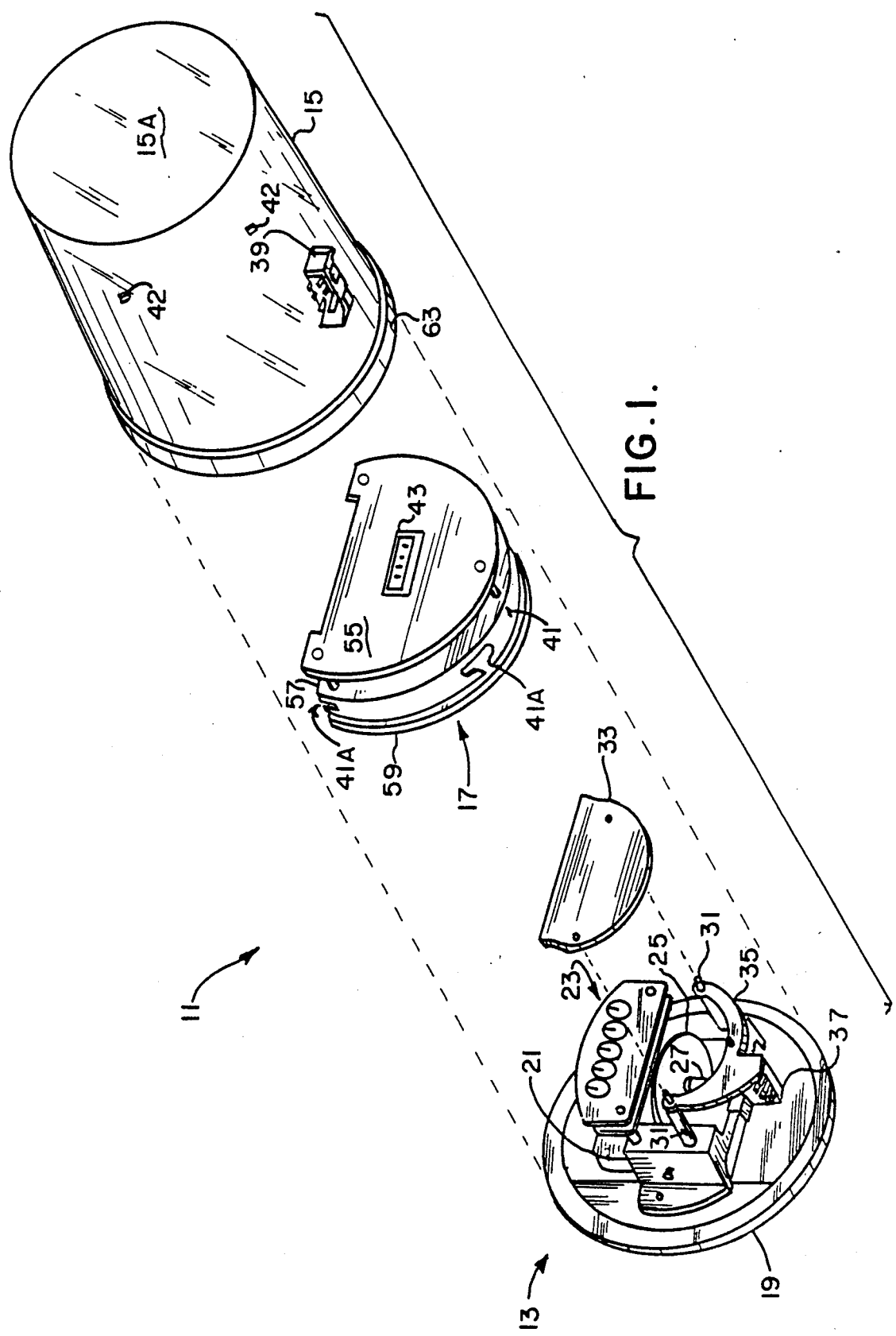
FIG. 1 is an exploded perspective view of an integrated meter/transponder package of the present invention.

A meter transponder package 11 of the present invention (FIG. 1) includes an electricity meter assembly 13, a cover 15, and a transponder assembly 17 carried by the cover. Electricity meter assembly 13 includes meter base plate 19 and a watthour meter 21 which conform to current standards such as ANSI Standard C12.1-1982. The meter, for example and not by way of limitation, is a standard 240 VAC, single stator watthour meter. The transponder is designed so as not to impact the performance and accuracy of the watthour meter.

Meter assembly 13 includes a standard visual display or mechanical dial 23 for displaying the watthour usage for manual reading. Immediately below dial 23 is a rotating disk 25 which, in the conventional manner, rotates about a shaft 27 as a function of the watthour usage being measured by the meter. A pair of posts 31 extend outwardly from the body of meter 21 to support an identification plate 33, as is typical with such meters.

Mounted on posts 31 (in addition to the identification plate) is a yoke or adapter 35 which supports a first connector-half 37 at a predetermined position with respect to the meter. Connector-half 37 is a female connector-half which mates with a male connector-half 39 secured to the inner wall of cover 15 to form a connector block. As can be seen from FIG. 1, connector-half 39 is disposed at a location on the inner wall of cover 15 selected so that connector-half 39 mates with connector-half 37 to complete electrical connection therebetween when cover 15 is secured to meter base 19.

Although cover 15 is shown in FIG. 1 as transparent, this is so that connector-half 39 can be seen. It is preferred that the sides of cover 15 be opaque to reduce the heat load on the interior of the transponder while the end 15A of the cover is transparent for reasons which will become apparent.

The end of cover 15 nearest connector-half 39 is open and the interior of the cover is hollow to form a recess for receiving transponder assembly 17 and meter assembly 13. Transponder assembly 17 includes a flange 41 for fixedly securing the assembly to cover 15. More particularly, flange 41 includes a plurality of notches 41A formed therein which accept corresponding posts 42 formed in the cover 15 to snap the transponder into place with respect to the cover.

As is also shown in FIG. 1, the transponder assembly includes a digital display 43 for digitally displaying to an observer the information from meter 21 through transparent end 15A of cover 15. Other electrical components are also included in transponder assembly 17, but are not shown in FIG. 1 for purposes of clarity.

Figure 2:
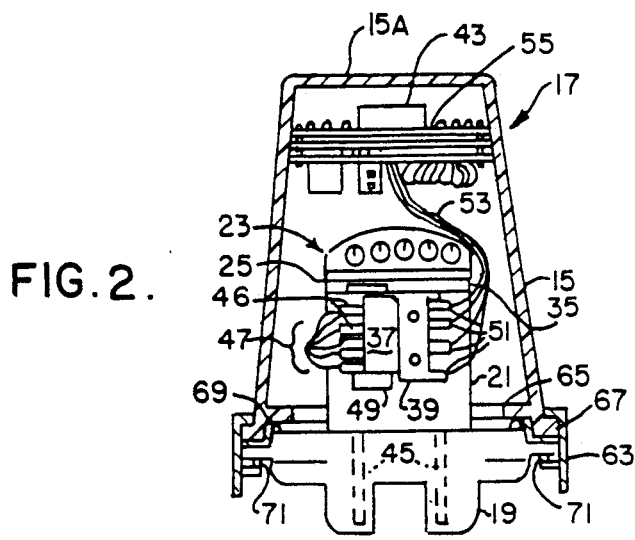
FIG. 2 is a side elevation with parts broken away for clarity of the meter/transponder package of FIG. 1.

Turning to FIG. 2, watthour meter 21 includes terminals 45 for making connection to the circuit (not shown) whose watthours are to be measured. These terminals are connected in the conventional manner to the rest of meter 21 to suitably rotate disk 25 to measure the watthours. Connection is also made between these terminals and a set of terminals 46 of connector-half 37 by means of a set of wires 47 to provide power for transponder assembly 17 and to supply information from the transponder assembly back to the power mains to provide that information to the central site.

As shown in FIG. 2 yoke 35 includes a lower arm 49 to support connector-half 37 at the bottom to hold it securely in position as connection is made with connector-half 39 carried by the cover. Connector-half 39 also includes a set of terminals 51 connected by a set of wires 53 to the circuitry of transponder assembly 17. When cover 15 is secured in place on meter base 19, electrical connection is made by connector-halves between meter 21 and transponder assembly 17.

Figure 3:
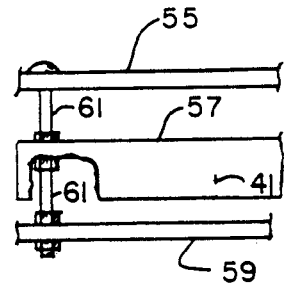
FIG. 3 is a side elevation, on an enlarged scale of transponder mounting structure used in the package of FIG. 1.

As shown in FIGS. 2 and 3, transponder assembly 17 has three levels. The first, labelled 55, is a circuit board which carries the transponder sensing and transmitting circuitry (not shown in FIG. 3 for clarity). Circuit board 55 is suitably mounted on a plate 57 which forms the second level and which carries flange 41. A second circuit board 59, forming the third level, carries the power supply circuitry for the circuitry on board 55 and for the pulse initiator assembly of FIG. 8, described below.

Circuit board 59 is also suitably mounted, such as by the posts 61 shown in FIG. 3, to plate 57. Since each circuit board is fixed with respect to the plate, mounting of plate 57 to cover 15 by snapping it into place as described above mounts the entire transponder assembly 17 in the position shown in FIG. 2 with respect to cover 15 and meter assembly 13.

Wire set 53 provides electrical connection between the transmitting circuitry of transponder assembly 17 on circuit board 55 and the power supply circuitry on board 59 on the one hand and the terminals 51 of second connector-half 39 on the other. As a result, when the two connector-halves are connected, by the securing of the cover to the meter base, there is automatically electrical connection between meter 21 and the circuits carried by circuit boards 55 and 59. That is, the electronics of transponder assembly 17 are engaged when cover 15 is installed onto meter base 19 in an action which mimics the present industry procedure of installing a glass cover over a watthour meter.

Cover 15, instead of being glass as are present meter covers, is a molded polycarbonate. It may be of either two-piece construction with the cylinder of the cover being one piece and end 15A being the second, or it may be of one-piece construction as desired. A stainless steel mounting ring of conventional construction is disposed at the base of cover 15 to secure the cover to meter base 19.

As shown in FIG. 1, the top portions of circuit boards 55 and 59 as well as metal plate 57 are generally cut-off to provide line-of-sight access to mechanical dial 23 of the watthour meter 21. If desired, the transponder assembly may be mounted to end 15A of the cover by suitable fasteners in addition to being secured to the cover by bracket 41.

Cover 15 (FIG. 2) at its open end includes an inwardly extending lip 65 which extends circumferentially around the inner wall of the cover. Below inwardly extending lip 65 is an outwardly extending lip 67 which extends circumferentially around the outer wall of the cover. These two lips provide sealing surfaces between the cover and either of two different sizes or models of meter base so that cover 15 can be used with either type of meter base. As shown in FIG. 2 the inwardly extending lip 65 is engaged by an O-ring 69 of meter base 19.

Figure 4:
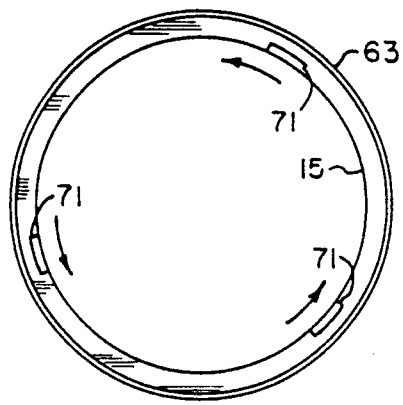
FIG. 4 is a bottom plan of the cover used in the present invention, showing the direction of rotation of the cover to secure it to the electricity meter.
Figure 5:
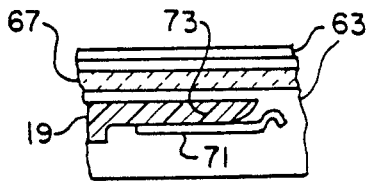
FIG. 5 is an enlarged elevational view of mounting structure for securing the cover of FIG. 4 to the electricity meter.

To secure cover 15 to meter base 19, the cover is rotated in the direction shown in FIG. 4 with respect to the meter base. Mounting ring 63 includes a plurality of mounting arms 71 (FIGS. 4 and 5) which are secured to the mounting ring and are disposed inwardly from the body of the ring itself. As the cover is rotated with respect to the meter base, these mounting arms are engaged by corresponding lips 73 in meter base to tightly hold the cover to the meter base as shown in FIG. 2. This particular means for securing a cover to the meter base is conventional.

Figure 6:
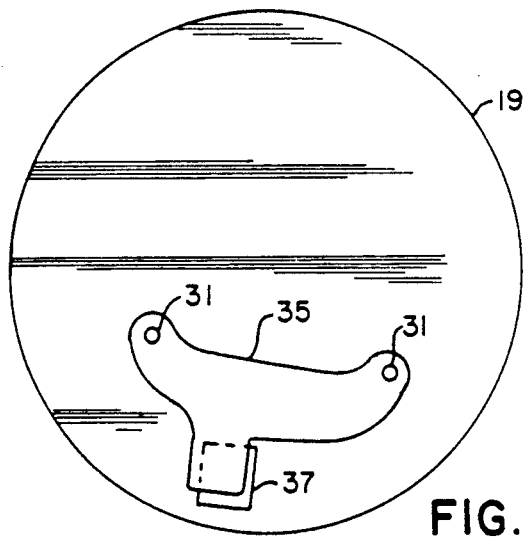
FIG. 6 is a simplified schematic illustrating the mounting of an electrical connector-half near the periphery of the electricity meter.
Figure 7A:
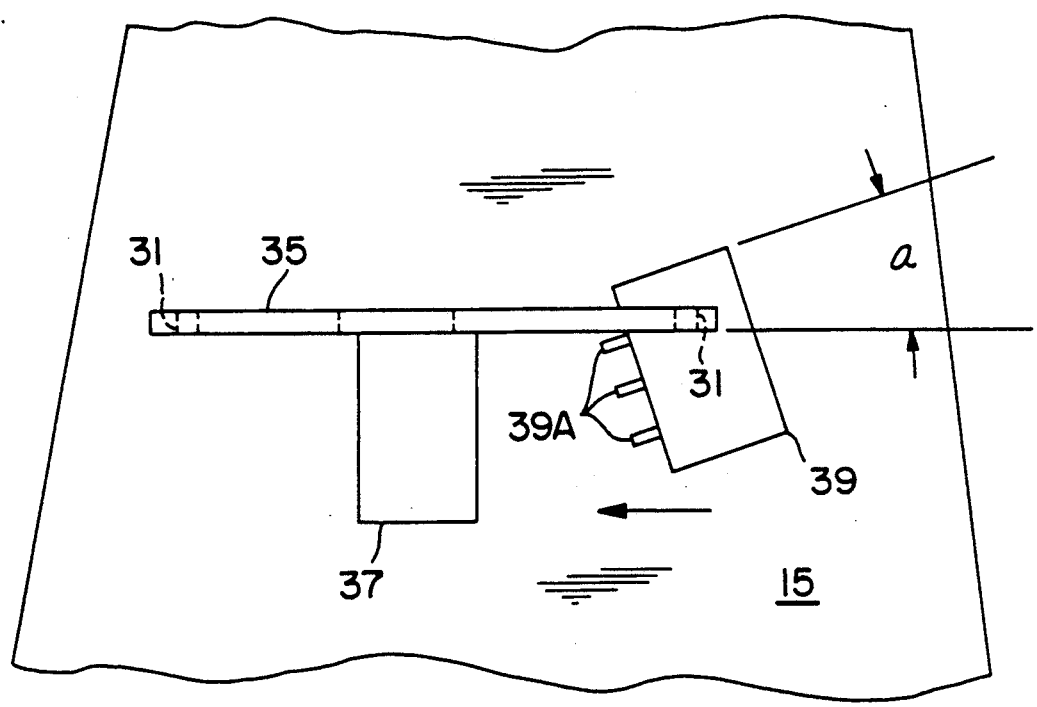
FIGS. 7A and 7B are simplified top plan views illustrating the process of making electrical connection between the meter and the transponder of FIG. 1 as the cover of FIG. 4 is secured to the electricity meter.
Figure 7B:
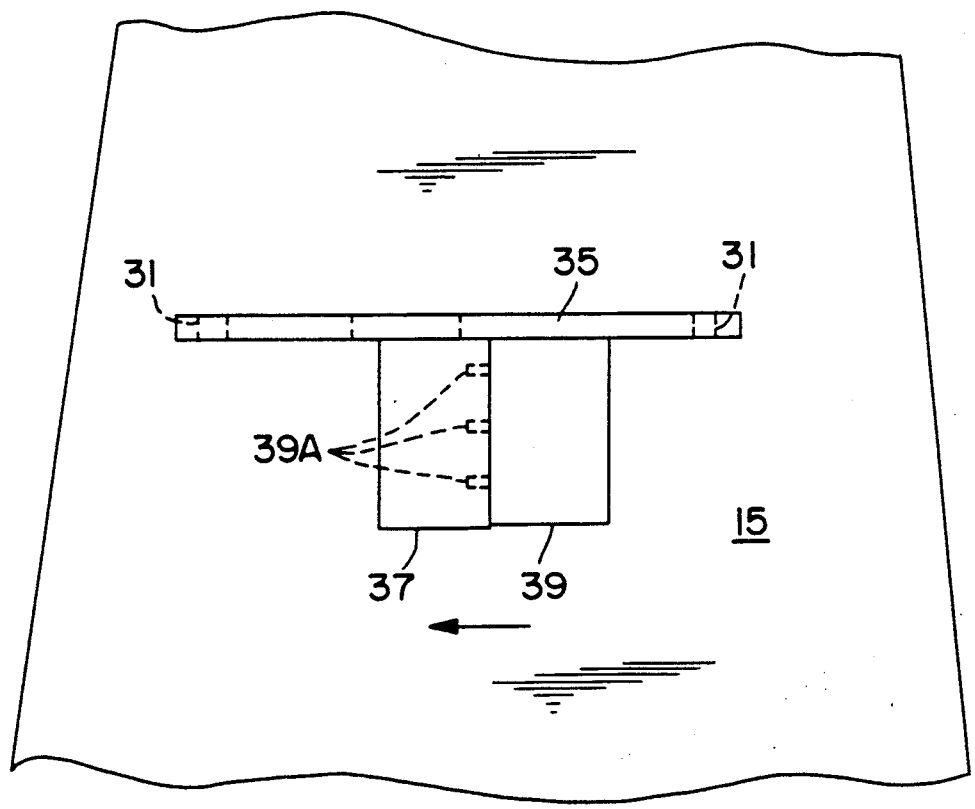

As shown in FIG. 6, yoke 35 disposes connector-half 37 along the periphery of meter base 19. This particular placement of the connector-half is not accidental. As can be seen in FIG. 7A, as the cover is rotated to become secured to the meter base the two connector-halves approach each other at some angle "a" because the rotational motion of the cover varies from truly linear motion. It is only when the cover is fully seated on the meter base (FIG. 7B) that the connector-halves are square with respect to each other. The particular angles of approach are minimized by placing the connector halves near the periphery of the meter base and the cover respectively.

It should be appreciated that the angle "a" is not an insignificant angle. It is desirable, to promote easy insertion of the prongs 39A into connector-half 37, to use connector-halves in which at least the prongs or terminals 39A are mechanically floating to take up or compensate for the variation of the closing motion from true linear motion. As the cover is secured to the meter base, these mechanically floating prongs move with respect to connector-half 39 as connection is made with connector-half 37. As a result, connection of these two connector-halves is accomplished easily despite their non-linear relative motion during connection.

Figure 8:
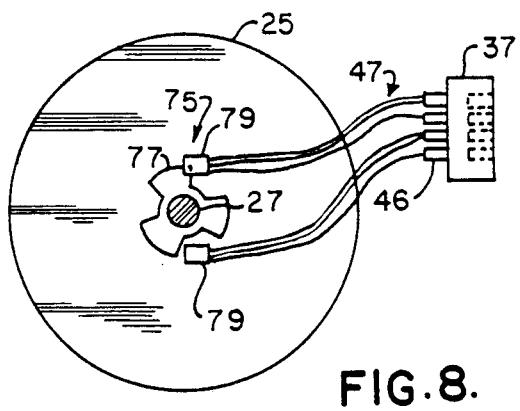
FIG. 8 is a simplified plan view of a pulse initiator assembly used to supply information from the electricity meter to the transponder.

Transponder assembly 17 requires some means for obtaining watthour information from meter 21. This is accomplished by a pulse initiator assembly 75 (FIG. 8). Pulse initiator assembly 75 includes a three-tab circular shutter 77 mounted on rotating shaft 27 below rotating disk 25. Optionally the shutter can be mounted above the rotating disk. Two photodetectors 79 consisting of opposed light-emitting diodes and photosensors are intercepted by shutter 77 as it rotates with disk 25. Power is supplied to the photodetectors from power supply board 59 in the transponder assembly by way of connector-half 37.

As shutter 77 rotates, the light pathway from the light-emitting diodes to their corresponding photosensors is made and broken. The output pulse from each photosensor produces an overlapped phased pulse set which is supplied by way of connector-half 37 to circuit board 55 of the transponder assembly. These pulses increment appropriate metering registers on that circuit board. The use of an overlapped phased pulse set prevents false pulses when meter disk 25 rotates backwards through a ninety degree rotation or when the meter disk is stopped and jittering at a point of pulse transition.

With this particular construction, it is possible and in fact easy to remove and replace the electronics of the transponder (excluding the pulse initiator assembly) on site without having to replace the watthour meter itself or the assemblies secured to the watthour meter.

In view of the above it will be seen that the various objects and features of the present invention are achieved and other advantageous results attained. The described embodiment is illustrative only and the present invention is defined instead by the claims which are appended hereto.

We claim:

1. An electricity meter transponder package comprising:
    an electricity meter assembly including an electricity meter such as a watthour mounted on a meter base and having terminals for connection to a circuit having a variable such as watthours to be measured;
    a cover having an open end and an inner recess for receiving the meter assembly, said cover being securable to the meter assembly to protect the meter assembly from environmental factors such as rain, dust and the like, a predetermined relative movement of the cover with respect to the meter assembly being required to secure the cover to the assembly;

a first electrical connector-half fixedly mounted with respect to the meter assembly, said connector-half having terminals electrically connected to the meter assembly;

a second electrical connector-half having terminals mateable with the terminals of the first connector-half, said second connector-half being fixedly mounted with respect to the cover in a position such that the predetermined relative movement of the cover with respect to the meter assembly causes the terminals of the first and second connector-halves to mate to complete electrical connection between their respective terminals; and at least one electrical circuit carried by the cover, said circuit being electrically connected to at least some terminals of the second connector-half, whereby securing of the cover to the meter assembly results in automatic electrical connection between the meter assembly and the circuit carried by the cover;

said predetermined relative movement required to secure the cover to the meter assembly being a rotation, said second connector-half being carried by the cover as said cover is rotated with respect to the meter assembly so that the corresponding relative motion of the two connector-halves varies from linear motion as the cover is rotated to secure the cover to the meter assembly, the terminals of at least one of the electrical connector-halves being mechanically floating throughout a predetermined range of movement so that variation of the relative movement of the electrical connector-halves from true linear motion as the cover is rotated with respect to the meter assembly is accommodated by floating of said terminals.

2. An electricity meter transponder package comprising:

an electricity meter such as a watthour having a first electrical connector-half fixedly mounted with respect to the meter, said connector-half having terminals electrically connected to the meter, said meter also having terminals for connection to a circuit having a variable such as watthours to be measured;

a cover having an open end and an inner recess for receiving the electricity meter to protect said meter, a predetermined relative rotational movement of the cover with respect to the meter being required to secure the cover to the meter;

a second electrical connector-half having terminals mateable with the terminals of the first connector-half, said second connector-half being fixedly mounted with respect to the cover in a position such that the predetermined relative rotational movement of the cover with respect to the meter causes the terminals of the first and second connector-halves to mate to complete electrical connection between their respective terminals;

the terminals of at least one of the electrical connector-halves being mechanically floating throughout a predetermined range of movement so that variations of the relative rotational movement of the electrical connector halves from true linear motion as the cover is rotated with respect to the meter is accommodated by floating of the terminals; and at least one electrical circuit carried by the cover, said circuit being electrically connected to at least some terminals of the second connector-half, whereby securing of the cover to the meter results in automatic electrical connection between the meter and the circuit carried by the cover.

3. The electricity meter transponder package as set forth in claim 2 wherein the first connector-half is disposed along the periphery of the meter and the second connector-half is secured to the linear wall of the cover.

4. The electricity meter transponder package as set forth in claim 2 wherein the at least one electrical circuit carried by the cover and electrically connected to at least some of the terminals of the second connector-half is mounted on a pair of circuit boards, said circuit boards being secured to and separated by a plate, said plate being secured to the cover to fix the pair of circuit boards in place with respect to the cover.

5. The electricity meter transponder package as set forth in claim 2 wherein the meter includes a rotating disk operatively connected to the meter assembly to rotate as a function of the variable being measured by the meter assembly, the rotation of the disk representing the variable being measured by the meter, further including sensing means secured to the meter adjacent the disk for sensing rotation of the disk, said sensing means being electrically connected to the first connector-half to supply measurement information to the electrical circuit carried by the cover when the two connector-halves are connected.

6. The electricity meter transponder package as set forth in claim 5 wherein the cover also carries a power supply circuit connected to the second connector-half, power from said power supply circuit being supplied to the sensing means when the two connector-halves are connected.

* * * * *